United States Patent
Pang

(10) Patent No.: US 7,689,967 B2
(45) Date of Patent: Mar. 30, 2010

(54) REFERENCE IMAGE GENERATION FROM SUBJECT IMAGE FOR PHOTOLITHOGRAPHY MASK ANALYSIS

(75) Inventor: Linyong Pang, Castro Valley, CA (US)

(73) Assignee: Synopsys, Inc., Mountain View, CA (US)

( * ) Notice: Subject to any disclaimer, the term of this patent is extended or adjusted under 35 U.S.C. 154(b) by 472 days.

(21) Appl. No.: 11/556,673

(22) Filed: Nov. 3, 2006

(65) Prior Publication Data

US 2007/0058852 A1    Mar. 15, 2007

Related U.S. Application Data

(62) Division of application No. 10/316,280, filed on Dec. 10, 2002, now Pat. No. 7,152,219.

(51) Int. Cl.
*G06F 17/50* (2006.01)
*G06K 9/00* (2006.01)
*G03F 1/00* (2006.01)

(52) U.S. Cl. .................. 716/19; 716/21; 382/144; 430/5

(58) Field of Classification Search ............ 716/19–21; 382/141, 144, 145, 149; 430/5, 22, 30; 356/237.1, 356/237.2, 237.3, 237.4, 237.5, 238.3
See application file for complete search history.

(56) References Cited

U.S. PATENT DOCUMENTS

| 6,268,093 | B1 | 7/2001 | Kenan et al. |
| 6,282,309 | B1 | 8/2001 | Emery |
| 6,466,314 | B1 * | 10/2002 | Lehman ................ 356/237.1 |
| 6,757,645 | B2 | 6/2004 | Chang et al. |
| 2003/0031356 | A1 * | 2/2003 | Sasa ...................... 382/145 |

* cited by examiner

*Primary Examiner*—Paul Dinh
(74) *Attorney, Agent, or Firm*—Bever, Hoffman & Harms, LLP; Jeanette S. Harms

(57) ABSTRACT

A reference image is generated from a subject image of at least a portion of a photolithography mask to enable a photolithography mask inspection and analysis system that otherwise cannot generate a reference image from a reference die or digitized design data, for example, to perform a mask analysis using the reference image. A mask inspection and analysis system may then be enhanced to perform one or more additional mask analyses to analyze the mask. The reference image is generated by identifying a defect or contaminant of the mask in the subject image and modifying the subject image to remove the defect or contaminant from the mask to generate the reference image. For one embodiment, a system using a STARlight inspection tool that captures transmitted and reflected images of a portion of a mask may then be enhanced to perform one or more mask analyses that use a reference image.

9 Claims, 5 Drawing Sheets

US 7,689,967 B2

REFERENCE IMAGE GENERATION FROM SUBJECT IMAGE FOR PHOTOLITHOGRAPHY MASK ANALYSIS

RELATED APPLICATIONS

This application is a divisional of U.S. patent application Ser. No. 10/316,280, entitled "Reference Image Generation From Subject Image for Photolithography Mask Analysis" filed Dec. 10, 2002.

BACKGROUND

1. Field of the Invention

The present invention relates generally to the field of photolithography masks. More particularly, the present invention relates to the field of photolithography mask inspection and analysis.

2. Description of Related Art

Images of a manufactured mask may be captured, inspected, and analyzed to help ensure a desired target pattern may be adequately printed using the mask. The inspection and analysis of a mask therefore help verify that integrated circuits (ICs) or similar objects manufactured using the mask will function. A mask may be inspected and analyzed, for example, to help verify critical dimension (CD) requirements have been met, to help identify any defects and contamination in the mask and assess their severity, and/or to help verify that the desired target pattern will be adequately aligned relative to underlying and overlying layers.

Some mask analyses require the availability of a reference image of an ideal or desired mask portion corresponding to the mask portion of the subject image to be analyzed. A die-to-die mask inspection tool, for example, generates a reference image by capturing light transmitted either through a similar portion on the same mask or through a reference die known to have no or negligible defects or contamination. A die-to-database mask inspection tool, for example, generates a reference image from digitized data of the design for the mask.

Where, however, a reference image cannot be generated or is otherwise unavailable, any mask analyses that use a reference image cannot be performed.

As one example, the Automatic Defect Severity Scoring (ADSS) technology of the Virtual Stepper® System developed by Numerical Technologies, Inc. of San Jose, Calif. may be used with a mask inspection tool to assess mask quality and the printability of mask defects. Because ADSS uses a reference image to perform one or more mask analyses, ADSS may not be used, for example, with a STARlight inspection tool provided by KLA-Tencor Corporation of San Jose, Calif. STARlight is a tradename used by KLA-Tencor Corporation for an inspection tool that captures transmitted and reflected images of a portion of a mask to identify defects and contaminants. A STARlight inspection tool, however, does not generate any reference images.

SUMMARY

Methods and apparatuses for generating a reference image from a subject image of at least a portion of a photolithography mask are described. By generating a reference image from a subject image, a system that otherwise cannot generate a reference image from a reference die or digitized design data, for example, can perform a mask analysis that uses a reference image. The system may therefore be enhanced to perform one or more additional mask analyses to inspect and analyze the mask.

For one method, an area of a defect or contaminant of a mask is identified in a subject image of at least a portion of the mask. Image data in the area of the defect or contaminant is then replaced with image data not having the defect or contaminant to generate a reference image.

For one embodiment, the subject image may comprise a transmitted image of at least a portion of the mask. An area of a defect or contaminant of the mask may be identified in the subject image by comparing at least a portion of the transmitted image to at least a portion of a reflected image of at least a portion of the mask. A STARlight mask inspection tool may therefore be enabled to generate a reference image and perform a mask analysis that uses the reference image.

For one embodiment, image data in the area of the defect or contaminant may be replaced by generating image data not having the defect or contaminant based on image data near the area of the defect or contaminant in the subject image. For one embodiment, the generation of image data may comprise extending an edge of the mask into the area of the defect or contaminant.

For one embodiment, the generation of a reference image from a subject image may be combined with the capturing of the subject image. In this manner, an inspection tool, for example, may be enhanced to generate a reference image.

For one embodiment, the generation of a reference image from a subject image may be combined with the analysis of the defect or contaminant of the mask using the subject image and the reference image. In this manner, a mask analyzer that uses reference images may be used with inspection tools, for example, that cannot generate reference images.

A computer-readable medium having instructions which, when executed by a computer system, cause the computer system to perform the method is also described.

For one apparatus, an inspection tool is to capture a subject image of at least a portion of a mask. A reference image generator is to identify an area of a defect or contaminant of the mask in the subject image and to replace image data in the area of the defect or contaminant with image data not having the defect or contaminant to generate a reference image.

For one embodiment, the inspection tool may capture a transmitted image of at least a portion of the mask as the subject image and capture a reflected image of at least a portion of the mask. The reference image generator may then compare at least a portion of the transmitted image to at least a portion of the reflected image to identify an area of a defect or contaminant of the mask in the subject image.

For one embodiment, the reference image generator may generate image data not having the defect or contaminant based on image data near the area of the defect or contaminant in the subject image. For one embodiment, the reference image generator may generate image data to extend an edge of the mask into the area of the defect or contaminant.

For another apparatus, a reference image generator to identify an area of a defect or contaminant of a mask in a subject image and to replace image data in the area of the defect or contaminant with image data not having the defect or contaminant to generate a reference image. A mask analyzer is to analyze a defect or contaminant of the mask using the subject image and the reference image.

For yet another apparatus, an inspection tool is to capture a subject image of at least a portion of a mask. A reference image generator is to identify an area of a defect or contaminant of the mask in the subject image and to replace image data in the area of the defect or contaminant with image data not having the defect or contaminant to generate a reference image. A mask analyzer is to analyze a defect or contaminant of the mask using the subject image and the reference image.

BRIEF DESCRIPTION OF THE DRAWINGS

Embodiments of the invention are illustrated by way of example and not limitation in the figures of the accompanying drawings, in which like references indicate similar elements and in which.

DETAILED DESCRIPTION

The following detailed description sets forth embodiments in accordance with the invention for reference image generation from subject image for photolithography mask analysis. Embodiments of the invention include methods, apparatuses, and computer-readable media having instructions for generating a reference image from a subject image of at least a portion of a photolithography mask. By generating a reference image from a subject image, embodiments of the invention enable a system that otherwise cannot generate a reference image from a reference die or digitized design data, for example, to perform a mask analysis that uses a reference image. Embodiments of the invention may therefore be used to enhance a system to perform one or more additional mask analyses.

Embodiments of the invention are first described with reference to FIGS. 1 and 2 in the context of a system that generates a reference image from a transmitted subject image to enable a mask analyzer to perform one or more mask analyses using the transmitted subject image and the reference image. For some embodiments, one or more areas having a defect or contaminant of a mask may be identified in the transmitted subject image by comparing the transmitted subject image to a reflected subject image captured by an inspection tool, such as a STARlight inspection tool for example. Image data in one or more identified defect areas in the transmitted subject image may then be replaced with image data not having a defect or a contaminant to generate the reference image. Embodiments to replace image data in this manner are described with reference to FIG. 3. Alternative embodiments of the invention are then described with reference to FIGS. 4 and 5.

Figure 1:
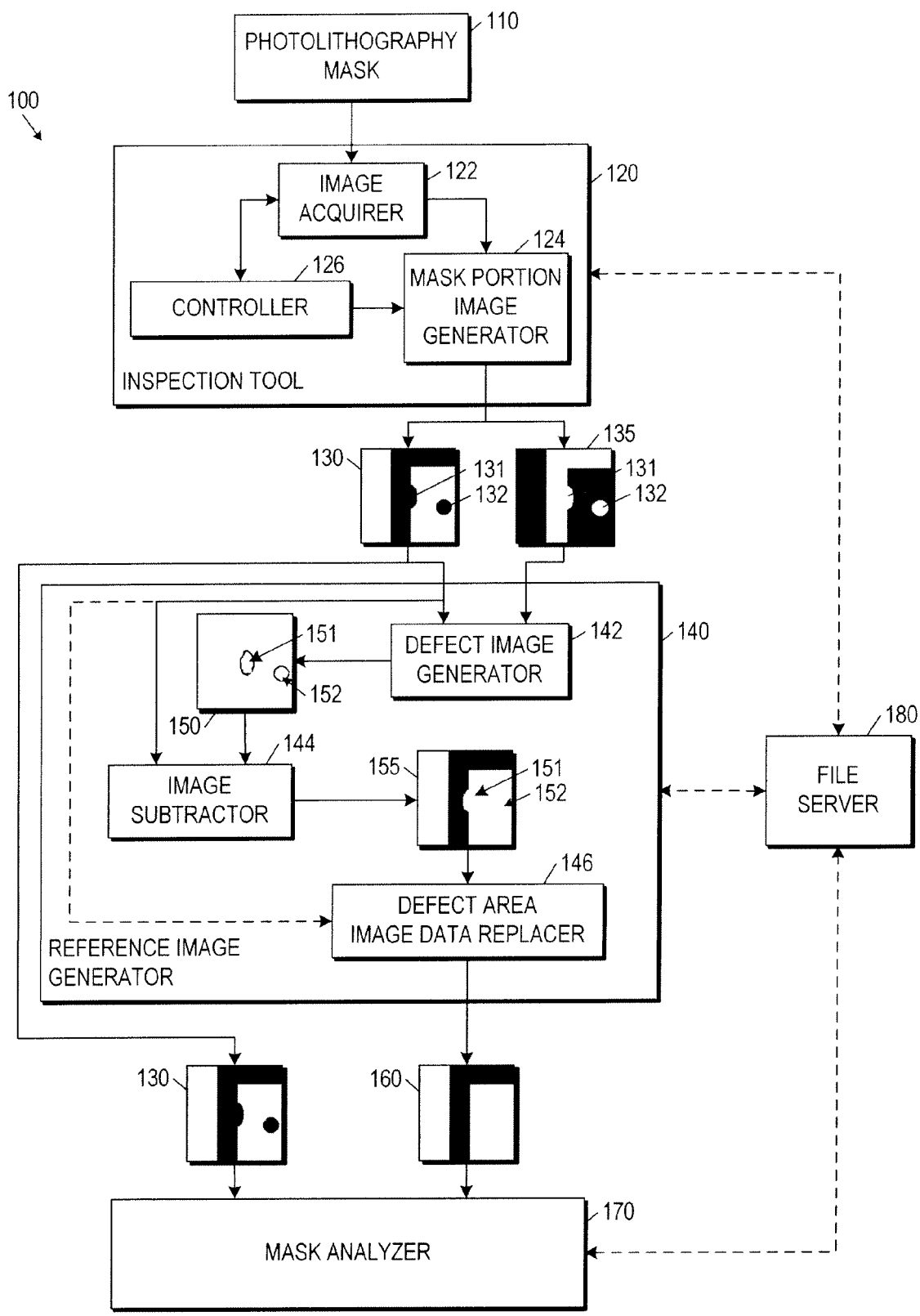
FIG. 1 illustrates, for one embodiment, a system that generates a reference image from a transmitted subject image and a reflected subject image captured by an inspection tool, such as a STARlight inspection tool for example.
Figure 2:
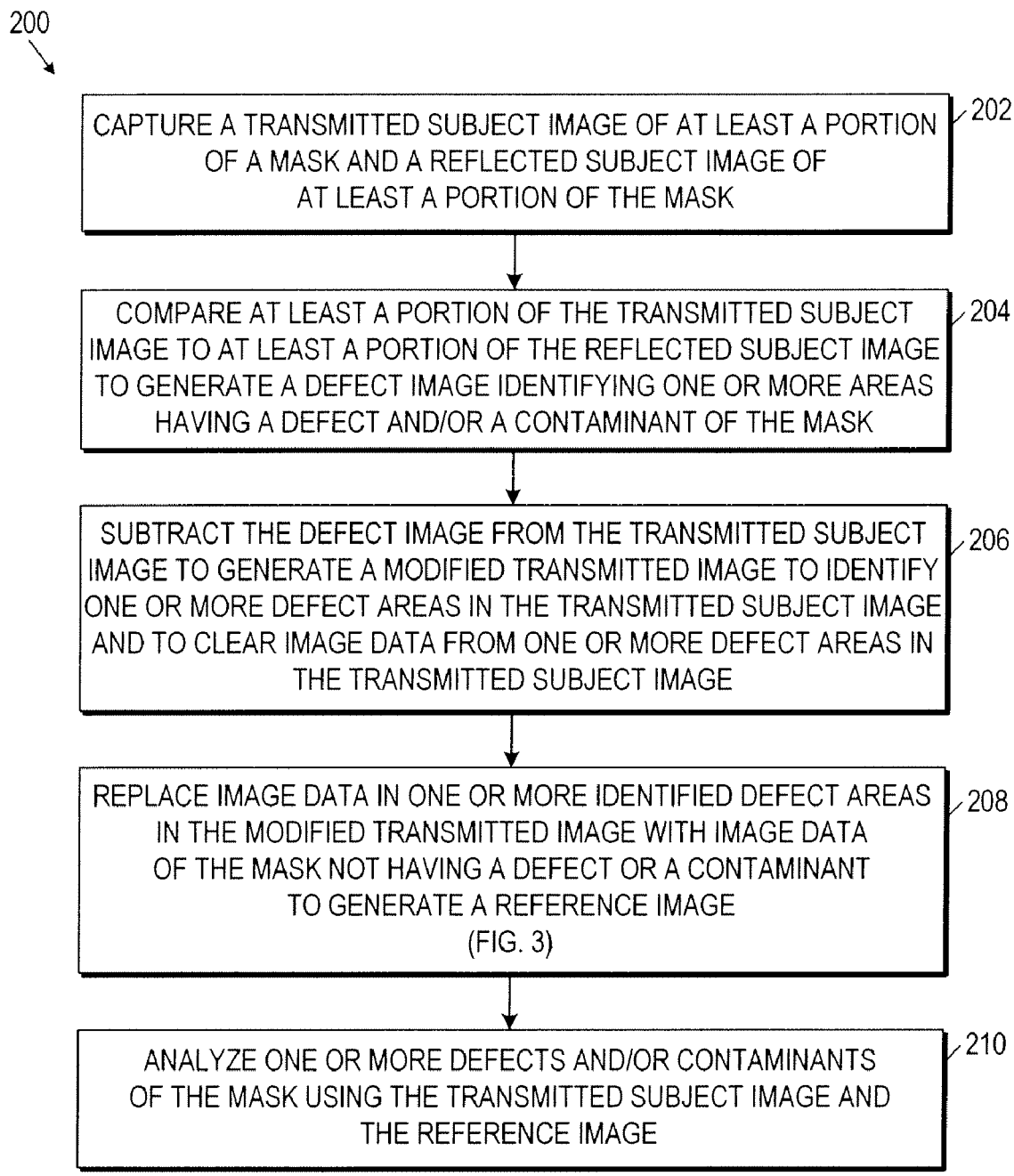
FIG. 2 illustrates, for one embodiment, a flow diagram to inspect and analyze a mask using the system of FIG. 1.
Figure 3:
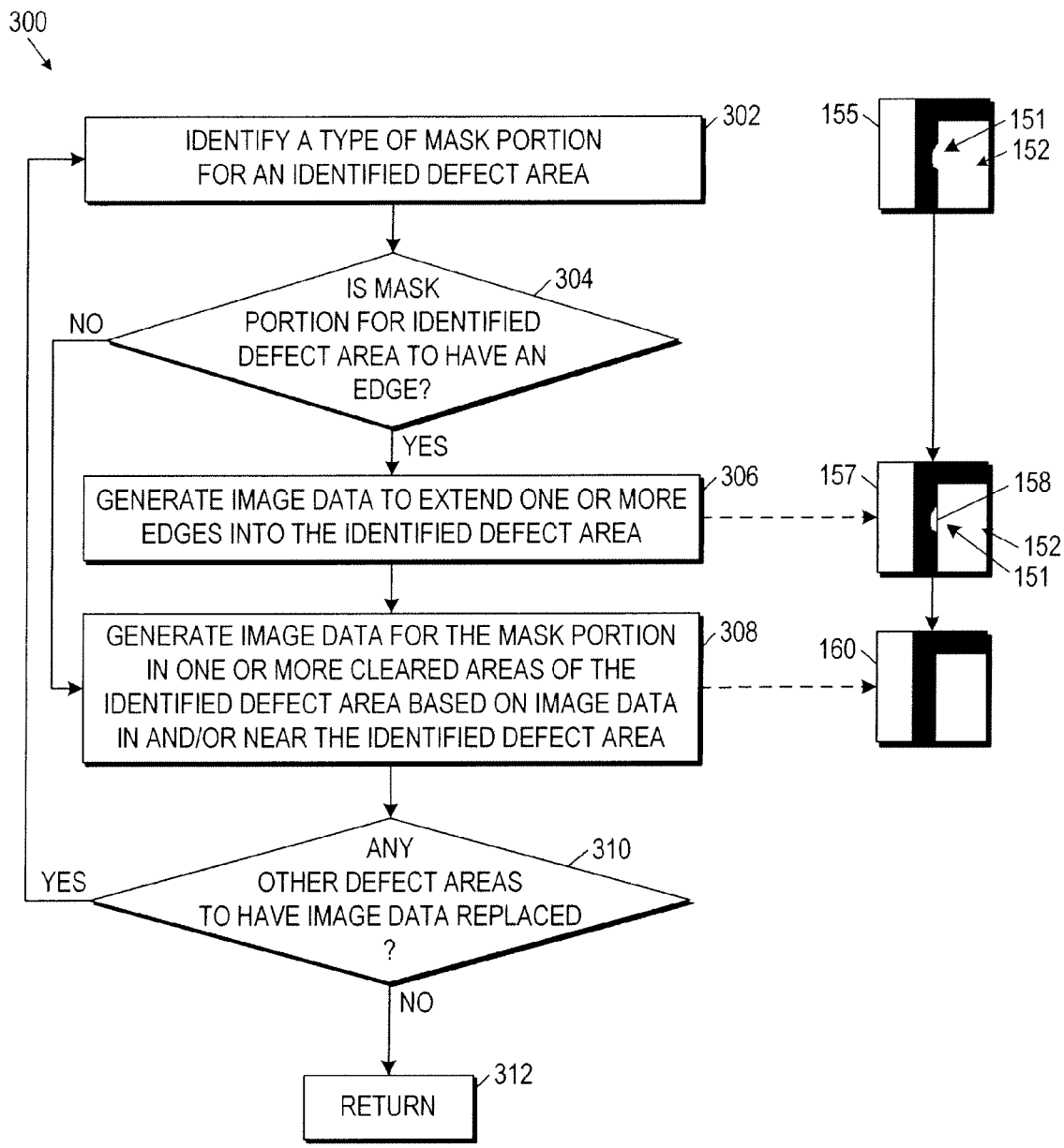
FIG. 3 illustrates, for one embodiment, a flow diagram to replace image data in one or more areas having a defect and/or a contaminant with image data not having a defect or a contaminant for the flow diagram of FIG. 2.

System 100 (FIGS. 1-3)

FIG. 1 illustrates, for one embodiment, a system 100 to inspect and analyze a photolithography mask 110. System 100 generates a reference image 160 from a transmitted subject image 130 of at least a portion of mask 110 and a reflected subject image 135 of at least a portion of mask 110 to enable system 100 to perform one or more analyses of mask 110 using reference image 160. For one embodiment, transmitted subject image 130 and reflected subject image 135 are of substantially the same portion of mask 110. System 100 identifies one or more defects and/or contaminants of mask 110 in transmitted subject image 130 using reflected subject image 135 and modifies transmitted subject image 130 to remove one or more identified defects and/or contaminants from mask 110 in transmitted subject image 130 to generate reference image 160.

System 100 for one embodiment may comprise an inspection tool 120, a reference image generator 140, and a mask analyzer 170. System 100 for one embodiment may inspect and analyze mask 110 in accordance with a flow diagram 200 of FIG. 2.

For block 202 of FIG. 2, inspection tool 120 captures transmitted subject image 130 of at least a portion of mask 110 and reflected subject image 135 of at least a portion of mask 110. Inspection tool 120 for one embodiment may capture transmitted subject image 130 and reflected subject image 135 of substantially the same portion of mask 110. Inspection tool 120 may capture transmitted subject image 130 and reflected subject image 135 of any suitable portion or all of mask 110 in any suitable manner. Inspection tool 120 for one embodiment may be a STARlight inspection tool provided by KLA-Tencor Corporation of San Jose, Calif. to capture transmitted subject image 130 and reflected subject image 135.

Inspection tool 120 for one embodiment may capture transmitted subject image 130 of a portion of mask 110 having one or more defects and/or contaminants and reflected subject image 135 of a portion of mask 110 having one or more defects and/or contaminants. A defect is a flaw in an intended pattern of a mask. Common defects in a mask include, for example, unintended chrome extensions and spots in clear portions, unintended chrome bridging across clear portions, unintended clear pinholes or extensions in dark portions, and unintended clear breaks across dark portions. A contaminant is any unwanted particle or material on the mask. Common contaminants include dust, dirt, debris, mites, etc. As one example, as illustrated in FIG. 1, inspection tool 120 may capture transmitted subject image 130 of a portion of mask 110 having a defect 131 and a contaminant 132 and reflected subject image 135 of a portion of mask 110 having defect 131 and contaminant 132.

Inspection tool 120 may capture transmitted subject image 130 and reflected subject image 135 in any suitable image data format. Inspection tool 120 for one embodiment may capture both transmitted subject image 130 and reflected subject image 135 in a suitable bitmapped graphics format, such as a Microsoft Windows® BMP format for example.

As illustrated in FIG. 1, inspection tool 120 for one embodiment may comprise an image acquirer 122, a mask portion image generator 124, and a controller 126. Inspection tool 120 for one embodiment may comprise image acquirer 122, mask portion image generator 124, and controller 126 in one package for use, for example, for on-line mask inspection. Inspection tool 120 for another embodiment may comprise image acquirer 122, mask portion image generator 124, and/or controller 126 as separate components which interface with one another for use, for example, for off-line mask inspection. Image acquirer 122, for example, may be a separate component from mask portion image generator 124 and controller 126.

Image acquirer 122 may comprise any suitable imaging device to scan mask 110 to capture and digitize one or more transmitted images of a portion or all of mask 110 and one or more reflected images of a portion or all of mask 110. Image acquirer 122 for one embodiment may comprise a suitable image capturing device interfaced with a suitable magnifying device to capture one or more magnified images of a portion or all of mask 110 and digitize captured images into image data of a suitable format. One suitable image capturing device comprises, for example, a charge coupled device (CCD). Suitable magnifying devices include, for example, a high resolution optical microscope, a scanning electron microscope (SEM), a focused ion beam (FIB) microscope, an atomic force microscope (AFM), and a near-field optical microscope for example.

Image acquirer 122 for one embodiment may capture a transmitted image by capturing suitable radiation transmitted through a single pattern or die of mask 110 and a corresponding reflected image by capturing suitable radiation reflected from that same pattern or die. Image acquirer 122 for one embodiment may digitize captured transmitted and reflected images into image data of a suitable bitmapped graphics format, such as a Microsoft Windows® BMP format for example. Image acquirer 122 for one embodiment may digitize captured transmitted and reflected images into n-bit gray scale image data.

Mask portion image generator 124 for one embodiment may receive transmitted image data of scanned portions of mask 110 from image acquirer 122 and may generate one or more transmitted subject images of a portion of mask 110. Mask portion image generator 124 for one embodiment may also receive reflected image data of scanned portions of mask 110 from image acquirer 122 and may generate one or more reflected subject images of a portion of mask 110.

Controller 126 for one embodiment may control how image acquirer 122 scans mask 110 and may control mask portion image generator 124 to output transmitted and reflected subject images of at least a portion of mask 110. Controller 126 for one embodiment may identify portions of mask 110 having one or more defects and/or one or more contaminants based on transmitted and reflected image data from image acquirer 122 and control mask portion image generator 124 to output transmitted and reflected subject images of portions of mask 110 having one or more defects and/or one or more contaminants.

Mask portion image generator 124 and controller 126 for one embodiment may be implemented by executing suitable instructions by one or more processors of a computer system coupled to image acquirer 122. Such instructions may be stored on any suitable computer-readable medium from which the instructions may be transmitted to or accessed by the computer system. As used in this description, suitable computer-readable media include, without limitation, a hard disk device, an optical disk device such as a compact disc (CD) or digital versatile disc (DVD) device for example, a Bernoulli disk device such as a Jaz or Zip disk device for example, a flash memory device, a file server, and/or any other suitable memory device. A computer system implementing mask portion image generator 124 and controller 126 for one embodiment may receive or access instructions from a suitable computer-readable medium that is a part of the computer system and/or from a suitable computer-readable medium, such as a file server 180 for example, external to the computer system at a local or remote location.

Mask portion image generator 124 and controller 126 for another embodiment may be implemented on separate computer systems. Mask portion image generator 124 for another embodiment may be a part of image acquirer 122.

Mask portion image generator 124 and controller 126 for another embodiment may receive preexisting image data of a portion or all of mask 110 stored on a suitable computer-readable medium, such as file server 180 for example, external to inspection tool 120 at a local or remote location. Inspection tool 120 for one embodiment may therefore not use or comprise image acquirer 122.

For another embodiment, image acquirer 122 may capture one or more transmitted subject images of a portion or all of mask 110 and one or more reflected subject images of a portion or all of mask 110. Inspection tool 120 for one embodiment may therefore not use or comprise mask portion image generator 124.

Inspection tool 120 for one embodiment may transmit transmitted subject image 130 and/or reflected subject image 135 to reference image generator 140 in any suitable manner or may store transmitted subject image 130 and/or reflected subject image 135 on a suitable computer-readable medium for later transmission to or access by reference image generator 140 and/or mask analyzer 170. Inspection tool 120 may store transmitted subject image 130 and/or reflected subject image 135 on a suitable computer-readable medium that is a part of inspection tool 120 and/or on a suitable computer-readable medium, such as file server 180 for example, external to inspection tool 120 at a local or remote location.

Inspection tool 120 for one embodiment may also transmit transmitted subject image 130 to mask analyzer 170 in any suitable manner.

Reference image generator 140 for one embodiment may receive transmitted subject image 130 and/or reflected subject image 135 from inspection tool 120 or may access transmitted subject image 130 and/or reflected subject image 135 from a suitable computer-readable medium, such as file server 180 for example. Reference image generator 140 for another embodiment may receive or access preexisting transmitted and/or reflected subject images stored on a suitable computer-readable medium, such as file server 180 for example, external to reference image generator 140 at a local or remote location. System 100 for one embodiment may therefore not use or comprise inspection tool 120.

For block 204 of FIG. 2, reference image generator 140 compares at least a portion of transmitted subject image 130 to at least a portion of reflected subject image 135 to generate a defect image 150 identifying one or more areas having a defect and/or a contaminant of mask 110. A comparison of transmitted subject image 130 and reflected subject image 135 helps identify defects and contaminants because the characteristics of a defect or contaminant cause an image of the defect or contaminant from reflected radiation to differ from an image of the defect or contaminant from transmitted radiation.

As illustrated in FIG. 1, reference image generator 140 for one embodiment may comprise a defect image generator 142 to compare at least a portion of transmitted subject image 130 to at least a portion of reflected subject image 135 to generate defect image 150 identifying one or more areas having a defect and/or a contaminant of mask 110. As one example, as illustrated in FIG. 1, defect image generator 142 may generate defect image 150 identifying a defect area 151 having defect 131 of mask 110 and a defect area 152 having contaminant 132 of mask 110.

Defect image generator 142 may generate defect image 150 to identify one or more defect areas in any suitable manner. Defect image generator 142 for one embodiment may identify a defect area in defect image 150 by generally outlining the defect area. As one example, as illustrated in FIG. 1, defect image generator 142 may generate defect image 150 of n-bit gray scale image data to identify defect areas 151 and 152 with a relatively dark outline.

Defect image generator 142 for another embodiment may be implemented as a part of inspection tool 120.

For block 206 of FIG. 2, reference image generator 140 subtracts defect image 150 from transmitted subject image 130 to generate a modified transmitted image 155 to identify one or more defect areas in transmitted subject image 130 and to clear image data from one or more defect areas in transmitted subject image 130. As illustrated in FIG. 1, reference image generator 140 for one embodiment may comprise an image subtractor 144 to subtract defect image 150 from transmitted subject image 130 to generate modified transmitted image 155. As one example, as illustrated in FIG. 1, image subtractor 144 may generate modified transmitted image 155 to identify and clear defect areas 151 and 152 in transmitted subject image 130.

For block 208 of FIG. 2, reference image generator 140 replaces image data in one or more identified defect areas in modified transmitted image 155 with image data of mask 110 not having a defect or a contaminant to generate reference image 160.

Reference image generator 140 may generate reference image 160 in any suitable image data format. Reference image generator 140 for one embodiment may generate reference image 160 in a suitable bitmapped graphics format, such as a Microsoft Windows® BMP format for example.

As illustrated in FIG. 1, reference image generator 140 for one embodiment may comprise defect area image data replacer 146 to replace image data in one or more identified defect areas in modified transmitted image 155 with image data of mask 110 not having a defect or a contaminant to generate reference image 160. As one example, as illustrated in FIG. 1, defect area image data replacer 146 may replace image data in defect area 151 with image data having an edge of a dark portion of mask 110 without any defects or contaminants. Defect area image data replacer 146 may also replace image data in defect area 152 with image data having a clear portion of mask 110 without any defects or contaminants.

Defect area image data replacer 146 may replace image data in one or more identified defect areas in modified transmitted image 155 with image data of mask 110 not having a defect or a contaminant in any suitable manner to generate reference image 160. Defect area image data replacer 146 for one embodiment may replace image data in modified transmitted image 155 in accordance with a flow diagram 300 of FIG. 3.

For block 302 of FIG. 3, defect area image data replacer 146 identifies a type of mask portion for an identified defect area in modified transmitted image 155. Defect area image data replacer 146 may identify any suitable type of mask portion for an identified defect area in any suitable manner. Defect area image data replacer 146 for one embodiment may identify a type of mask portion for an identified defect area by analyzing image data adjacent, near, around, or surrounding the identified defect area and/or by analyzing image data in the identified defect area. For one embodiment, defect area image data replacer 146 may optionally receive a copy of transmitted subject image 130 as received by reference image generator 140 to analyze image data in transmitted subject image 130.

Defect area image data replacer 146 for one embodiment may identify whether a mask portion for an identified defect area is to have an edge between, for example, a dark portion and a clear portion of mask 110 or is to be wholly contained, for example, within a dark portion or clear portion of mask 110. Defect area image data replacer 146 for one embodiment may use a suitable edge detection technique to identify whether image data adjacent, near, around, or surrounding, and/or in an identified defect area of transmitted subject image 130 has an edge.

If the mask portion for the identified defect area is to have an edge, as identified for block 304, defect area image data replacer 146 for block 306 generates image data to extend one or more edges into the identified defect area. Defect area image data replacer 146 for one embodiment may generate image data in the identified defect area to extend into the identified defect area any edges leading into the identified defect area until the edge intersects another extended edge in the identified defect area to form a corner, for example, until the edge meets another extended edge to form one edge across the identified defect area, or until the edge exits the identified defect area. As illustrated in the example of FIG. 3, the mask portion for defect area 151 has an edge extending through defect area 151 as identified by the image data near defect area 151 having two edges leading into defect area 151 and/or by image data in defect area 151 of transmitted subject image 130 having the edge. One or both edges leading into defect area 151 may be extended to generate an image 157 having an edge extension 158 across defect area 151.

If the mask portion for the identified defect area is not to have an edge, as identified for block 304, defect area image data replacer 146 skips operations for block 306. As illustrated in the example of FIG. 3, the mask portion for defect area 152 does not have any edges as identified by the image data near defect area 152 not having any edges leading into defect area 152 and/or by image data in defect area 152 of transmitted subject image 130 not having any edges.

For block 308, defect area image data replacer 146 generates image data for the mask portion in one or more cleared areas of the identified defect area based on image data that is adjacent, near, around, or surrounding, and/or in the identified defect area. Where the identified defect area has one or more edges extended into the identified defect area, defect area image data replacer 146 for one embodiment may generate image data in one or more cleared areas defined by one or more extended edges and a border of the identified defect area.

Defect area image data replacer 146 may generate image data in a cleared area of the identified defect area in any suitable manner. Defect area image data replacer 146 for one embodiment may generate image data to fill a cleared area of the identified defect area by interpolating image data values based on the image data adjacent, near, around, and/or surrounding the cleared area. For one embodiment where transmitted subject image 130 comprises n-bit gray scale image data, defect area image data replacer 146 may interpolate gray scale values in generating image data to fill a cleared area.

As illustrated in the example of FIG. 3, defect area 151 of image 157 has two cleared areas: a first one defined by edge extension 158 and the border of defect area 151 adjacent image data for a dark portion of mask 110 and a second one defined by edge extension 158 and the border of defect area 151 adjacent image data for a clear portion of mask 110. The first cleared area may be filled, for example, by interpolating image data values based on the image data adjacent, for example, the first cleared area in the dark portion of mask 110. The second cleared area may be filled, for example, by interpolating image data values based on the image data adjacent, for example, the second cleared area in the clear portion of mask 110. Defect area 152 has one cleared area that may be filled, for example, by interpolating image data values based on the image data adjacent, for example, defect area 152.

Defect area image data replacer 146 for another embodiment may generate image data to fill a cleared area of the identified defect area by using image data of any mask portion not having any defects and/or contaminants in the identified defect area, if possible, and then interpolating image data values based on such image data and/or image data adjacent, near, around, and/or surrounding the cleared area.

Defect area image data replacer 146 for one embodiment may perform operations for blocks 302, 304, 306, and 308 to replace image data for each of one or more identified defect areas of modified transmitted image 155 until defect area image data replacer 146 identifies for block 310 that no other defect areas are to have image data replaced. Defect area image data replacer 146 may then return for block 312 with reference image 160 generated.

Defect area image data replacer 146 for another embodiment may perform operations for blocks 302-308 in any suitable order and may or may not overlap in time the performance of any suitable operation with any other suitable operation. As one example, defect area image data replacer 146 may perform operations for block 302 for more than one identified defect area of modified transmitted image 155, then perform operations for block 306 for any of those identified defect areas having a mask portion that is to have an edge as identified for block 304, and then perform operations for block 308 for those identified defect areas.

Reference image generator 140 for one embodiment may transmit reference image 160 to mask analyzer 170 in any suitable manner or may store reference image 160 on a suitable computer-readable medium for later transmission to or access by mask analyzer 170. Reference image generator 140 for one embodiment may store reference image 160 on a suitable computer-readable medium that is a part of reference image generator 140 and/or on a suitable computer-readable medium, such as file server 180 for example, external to reference image generator 140 at a local or remote location.

Reference image generator 140 for one embodiment may also transmit transmitted subject image 130 to mask analyzer 170 in any suitable manner or may store transmitted subject image 130 on a suitable computer-readable medium for later transmission to or access by mask analyzer 170.

Reference image generator 140 for one embodiment may be implemented by executing suitable instructions by one or more processors of a computer system. Such instructions may be stored on any suitable computer-readable medium from which the instructions may be transmitted to or accessed by the computer system. A computer system implementing reference image generator 140 for one embodiment may receive or access instructions from a suitable computer-readable medium that is a part of the computer system and/or from a suitable computer-readable medium, such as file server 180 for example, external to the computer system at a local or remote location. Reference image generator 140 may be implemented on a same computer system used by inspection tool 120 or on a separate computer system.

Mask analyzer 170 may receive transmitted subject image 130 from inspection tool 120 or reference image generator 140 or may access transmitted subject image 130 from a suitable computer-readable medium, such as file server 180 for example. Mask analyzer 170 may receive reference image 160 from reference image generator 140 or may access reference image 160 from a suitable computer-readable medium, such as file server 180 for example.

For block 210 of FIG. 2, mask analyzer 170 analyzes one or more defects and/or contaminants of mask 110 using transmitted subject image 130 and reference image 160. Mask analyzer 170 may use transmitted subject image 130 and reference image 160 in any suitable manner to analyze one or more defects and/or contaminants of mask 110 in any suitable manner. As one example, mask analyzer 170 may analyze transmitted subject image 130 relative to reference image 160 to assess the severity of defects and/or contaminants in the portion of mask 110 in transmitted subject image 130.

Mask analyzer 170 for one embodiment may be implemented by executing suitable instructions by one or more processors of a computer system. Such instructions may be stored on any suitable computer-readable medium from which the instructions may be transmitted to or accessed by the computer system. A computer system implementing mask analyzer 170 for one embodiment may receive or access instructions from a suitable computer-readable medium that is a part of the computer system and/or from a suitable computer-readable medium, such as file server 180 for example, external to the computer system at a local or remote location. Mask analyzer 170 may be implemented on a same computer system used by inspection tool 120 and/or reference image generator 140 or on a separate computer system.

Mask analyzer 170 for one embodiment comprises the Virtual Stepper® System developed by Numerical Technologies, Inc. of San Jose, Calif. The Automatic Defect Severity Scoring (ADSS) technology of the Virtual Stepper® System provides, for example, automatic defect and contamination detection, printability simulation, defect impact analysis, and critical dimension (CD) measurements. ADSS uses both a subject image and a reference image to perform one or more mask analyses. Suitable mask analyses that use a subject image and a reference image are described, for example, in U.S. Patent Application Publication US 2002/0019729 A1, entitled VISUAL INSPECTION AND VERIFICATION SYSTEM and published Feb. 14, 2002; U.S. Patent Application Publication US 2002/0035461 A1, entitled VISUAL ANALYSIS AND VERIFICATION SYSTEM USING ADVANCED TOOLS and published Mar. 21, 2002; U.S. Patent Application Publication US 2002/0164064 A1, entitled SYSTEM AND METHOD OF PROVIDING MASK QUALITY CONTROL and published Nov. 7, 2002; and U.S. Patent Application Publication No. US 2002/0164065 A1, entitled SYSTEM AND METHOD OF PROVIDING MASK DEFECT PRINTABILITY ANALYSIS and published Nov. 7, 2002. These patent application publications are herein incorporated by reference.

Because system 100 comprises reference image generator 140 to generate reference image 160 from transmitted subject image 130, system 100 may comprise any suitable mask analyzer 170 to perform any suitable mask analysis that uses a subject image and a reference image despite the inability of inspection tool 120 to generate reference images and regardless of the availability or accessibility of a corresponding reference image by system 100 for a given subject image.

For one embodiment, computer-executable instructions to implement reference image generator 140 may optionally be integrated with any suitable mask analyzer software package, including an existing mask analyzer software package, to form one software package that may be loaded onto a computer system for inspection tool 120 or onto a separate computer system for system 100. In this manner, a mask analyzer software package otherwise incompatible with a mask inspection tool because of the inability of the inspection tool to obtain or generate a corresponding reference image for a given subject image may now be used with the inspection tool.

For another embodiment, computer-executable instructions to implement reference image generator 140 may optionally be integrated with any suitable software executed by inspection tool 120 to allow inspection tool 120 to be used with any suitable mask analyzer software package that uses a subject image and a reference image for a mask analysis.

Figure 4:
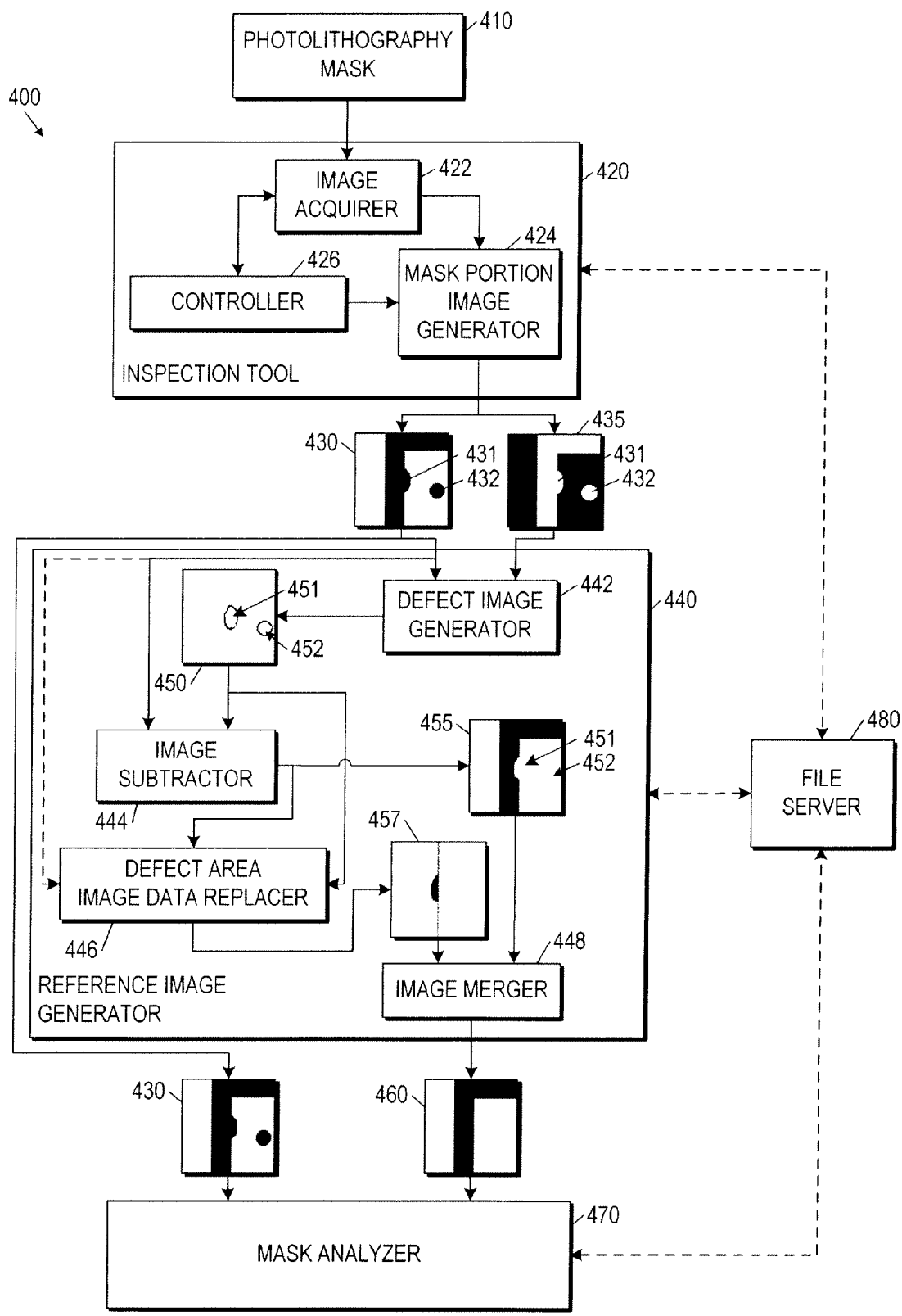
FIG. 4 illustrates, for one embodiment, a system that generates a reference image from a transmitted subject image and a reflected subject image captured by an inspection tool, such as a STARlight inspection tool for example.
Figure 5:
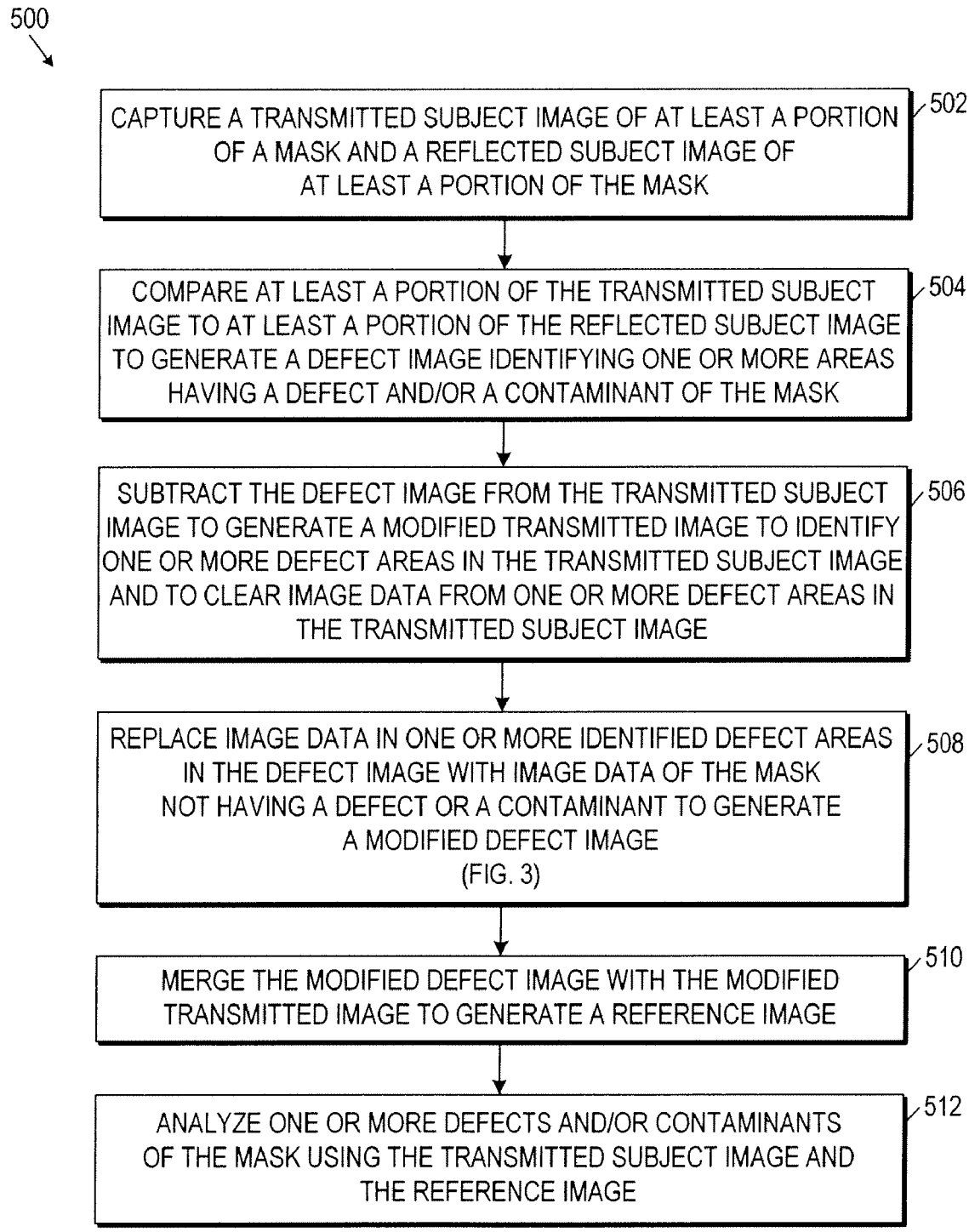
FIG. 5 illustrates, for one embodiment, a flow diagram to inspect and analyze a mask using the system of FIG. 4.

System 400 (FIGS. 4-5)

Instead of directly replacing image data in one or more identified defect areas in modified transmitted image 155, image data in one or more identified defect areas in defect image 150 may be replaced with image data of mask 110 not having a defect or a contaminant. Defect image 150 may then be merged with modified transmitted image 155 to generate reference image 160. FIG. 4 illustrates, for one embodiment, a system 400 that generates a reference image 460 in this manner to inspect and analyze a photolithography mask 410.

System 400 for one embodiment, as illustrated in FIG. 4, may comprise an inspection tool 420, a reference image generator 440, and a mask analyzer 470. Inspection tool 420 generally corresponds to inspection tool 120 of FIG. 1, reference image generator 440 generally corresponds to reference image generator 140 of FIG. 1, and mask analyzer 470 generally corresponds to mask analyzer 170 of FIG. 1. An optional file server 480 that may be coupled to inspection tool 420, reference image generator 440, and/or mask analyzer 470 generally corresponds to file server 180 of FIG. 1. System 400 for one embodiment may inspect and analyze mask 410 in accordance with a flow diagram 500 of FIG. 5.

The description of system 100 and flow diagram 200 not inconsistent with the description of system 400 and flow diagram 500 similarly applies to system 400 and flow diagram 500.

For block 502 of FIG. 5, inspection tool 420 captures a transmitted subject image 430 of at least a portion of mask 410 and a reflected subject image 435 of at least a portion of mask 410. For one embodiment, transmitted subject image 430 and reflected subject image 435 are of substantially the same portion of mask 410. As illustrated in FIG. 4, inspection tool 420 for one embodiment may comprise an image acquirer 422, a mask portion image generator 424, and a controller 426. Image acquirer 422, mask portion image generator 424, and controller 426 generally correspond to image acquirer 122, mask portion image generator 124, and controller 126 of FIG. 1.

For block 504, reference image generator 440 compares at least a portion of transmitted subject image 430 to at least a portion of reflected subject image 435 to generate a defect image 450 identifying one or more areas having a defect and/or a contaminant of mask 410. As illustrated in FIG. 4, reference image generator 440 for one embodiment may comprise a defect image generator 442 to generate defect image 450. As one example, as illustrated in FIG. 4, defect image generator 442 may generate defect image 450 to identify a defect area 451 having a defect 431 of mask 410 and a defect area 452 having a contaminant 432 of mask 410. Defect image generator 442 generally corresponds to defect image generator 142 of FIG. 1.

For block 506, reference image generator 440 subtracts defect image 450 from transmitted subject image 430 to generate a modified transmitted image 455 to identify one or more defect areas in transmitted subject image 430 and to clear image data from one or more defect areas in transmitted subject image 430. As illustrated in FIG. 4, reference image generator 440 for one embodiment may comprise an image subtractor 444 to subtract defect image 450 from transmitted subject image 430 to generate modified transmitted image 455. Image subtractor 444 generally corresponds to image subtractor 144 of FIG. 1.

For block 508, reference image generator 440 replaces image data in one or more identified defect areas in defect image 450 with image data of mask 410 not having a defect or a contaminant to generate a modified defect image 457. As illustrated in FIG. 4, reference image generator 440 for one embodiment may comprise a defect area image data replacer 446 to replace image data in one or more identified defect areas in defect image 450 to generate modified defect image 457. Defect area image data replacer 446 generally corresponds to defect area image data replacer 146 of FIG. 1.

Defect area image data replacer 446 may replace image data in one or more identified defect areas in defect image 450 with image data of mask 410 not having a defect or a contaminant in any suitable manner to generate modified defect image 457. Defect area image data replacer 446 for one embodiment may replace image data in defect image 450 in accordance with flow diagram 300 of FIG. 3, using modified transmitted image 455 and/or transmitted subject image 430 to analyze image data adjacent, near, around, or surrounding an identified defect area and/or to analyze image data in an identified defect area.

For block 510, reference image generator 440 merges modified defect image 457 with modified transmitted image 455 to generate reference image 460. As illustrated in FIG. 4, reference image generator 440 for one embodiment may comprise an image merger 448 to merge modified defect image 457 with modified transmitted image 455 to generate reference image 460.

Image merger 448 for one embodiment may be implemented by executing suitable instructions by one or more processors of a computer system. Such instructions may be stored on any suitable computer-readable medium from which the instructions may be transmitted to or accessed by the computer system. A computer system implementing image merger 448 for one embodiment may receive or access instructions from a suitable computer-readable medium that is a part of the computer system and/or from a suitable computer-readable medium, such as file server 480 for example, external to the computer system at a local or remote location.

For block 512, mask analyzer 470 analyzes one or more defects and/or contaminants of mask 410 using transmitted subject image 430 and reference image 460. Mask analyzer 470 may use transmitted subject image 430 and reference image 460 in any suitable manner to analyze one or more defects and/or contaminants of mask 410 in any suitable manner.

In the foregoing description, one or more embodiments of the present invention have been described. It will, however, be evident that various modifications and changes may be made thereto without departing from the broader spirit or scope of the present invention as defined in the appended claims. The specification and drawings are, accordingly, to be regarded in an illustrative rather than a restrictive sense.

The invention claimed is:

1. An apparatus comprising:
   an inspection tool to capture a subject image of at least a portion of a mask; and
   a reference image generator to identify an area of a defect or contaminant of the mask in the subject image and to replace image data in the area of the defect or contaminant with image data not having the defect or contaminant to generate a reference image.

2. The apparatus of claim 1, wherein the inspection tool is to capture a transmitted image of at least a portion of the mask as the subject image and to capture a reflected image of at least a portion of the mask; and
   wherein the reference image generator is to compare at least a portion of the transmitted image to at least a portion of the reflected image to identify an area of a defect or contaminant of the mask in the subject image.

3. The apparatus of claim 1, wherein the reference image generator is to generate image data not having the defect or contaminant based on image data near the area of the defect or contaminant in the subject image.

4. The apparatus of claim 3, wherein the reference image generator is to generate image data to extend an edge of the mask into the area of the defect or contaminant.

5. An apparatus comprising:
   a reference image generator to identify an area of a defect or contaminant of a mask in a subject image and to replace image data in the area of the defect or contaminant with image data not having the defect or contaminant to generate a reference image; and
   a mask analyzer to analyze a defect or contaminant of the mask using the subject image and the reference image.

6. The apparatus of claim 5, wherein the reference image generator is to generate image data not having the defect or contaminant based on image data near the area of the defect or contaminant in the subject image.

7. The apparatus of claim 6, wherein the reference image generator is to generate image data to extend an edge of the mask into the area of the defect or contaminant.

8. An apparatus comprising:
   an inspection tool to generate a subject image of at least a portion of a mask;
   a reference image generator to identify an area of a defect or contaminant of the mask in the subject image and to replace image data in the area of the defect or contaminant with image data not having the defect or contaminant to generate a reference image; and
   a mask analyzer to analyze a defect or contaminant of the mask using the subject image and the reference image.

9. The apparatus of claim 8, wherein the inspection tool is to capture a transmitted image of at least a portion of the mask as the subject image and to capture a reflected image of at least a portion of the mask; and
   wherein the reference image generator is to compare at least a portion of the transmitted image to at least a portion of the reflected image to identify an area of a defect or contaminant of the mask in the subject image.

* * * * *